US006847254B2

(12) United States Patent
Pai

(10) Patent No.: US 6,847,254 B2
(45) Date of Patent: Jan. 25, 2005

(54) TEMPERATURE DETECTOR CIRCUIT AND METHOD THEREOF

(75) Inventor: Chung-Lung Pai, Taipei (TW)

(73) Assignee: Richtek Technology Corp., Hsinchu (TW)

( * ) Notice: Subject to any disclaimer, the term of this patent is extended or adjusted under 35 U.S.C. 154(b) by 0 days.

(21) Appl. No.: 10/623,635

(22) Filed: Jul. 22, 2003

(65) Prior Publication Data

US 2004/0104763 A1 Jun. 3, 2004

(30) Foreign Application Priority Data

Jul. 25, 2002 (TW) ....................................... 91116685 A

(51) Int. Cl.$^{7}$ ................................................ H01L 35/00
(52) U.S. Cl. ........................ 327/572; 327/538; 323/315
(58) Field of Search ................................ 327/512, 513, 327/362, 378, 539; 323/312, 315, 907

(56) References Cited

U.S. PATENT DOCUMENTS 4,313,082 A * 1/1982 Neidorff ..................... 323/312
5,563,760 A * 10/1996 Lowis et al. ................ 361/103
5,980,106 A * 11/1999 Yamamoto et al. ......... 374/178
6,222,470 B1 * 4/2001 Schuelke .................... 341/119
6,459,326 B2 * 10/2002 Descombes ................. 327/513
6,563,295 B2 * 5/2003 Juang ......................... 323/315

* cited by examiner

*Primary Examiner*—Minh Nguyen
(74) *Attorney, Agent, or Firm*—Rosenberg, Klein & Lee

(57) ABSTRACT

To generate a signal when a target temperature is reached, a temperature detector circuit is provided with a first and second current sources connected in series, of which the first current source generates a PTAT current and the second current source is supplied with a temperature-independent reference voltage to generate a second current proportional to the reference voltage. The first and second currents are a first and second reference currents, respectively, at a reference temperature, and the first and second current sources are configured such that the ratio of the second reference current to the first reference current is proportional to the ratio of the target temperature to the reference temperature.

19 Claims, 3 Drawing Sheets

TEMPERATURE DETECTOR CIRCUIT AND METHOD THEREOF

FIELD OF THE INVENTION

The present invention relates generally to a temperature detector circuit and method thereof, and more particularly, to a temperature detector circuit fabricated as an integrated circuit (IC) and method thereof.

BACKGROUND OF THE INVENTION

The work temperature of ICs is limited. When the temperature rises to exceed the allowed threshold, the circuit is operated probably in error or burnt out, resulting in a need of temperature detector circuit for necessary protection, especially to expensive devices such as CPU. For example, temperature switches are used to detect the temperature of IC to determine if it exceeds the allowed range, so as to immediately turn off power supply or start up remedial program to avoid the IC to be burnt out or operated in error.

FIG. 1 is a diagram of a conventional temperature detector circuit. The temperature detector circuit 10 connected between supply voltage VDD and ground GND will generate a signal on its output 17 when the temperature reaches a predetermined target temperature. The circuit 10 comprises a proportional-to-absolute-temperature (PTAT) current source 12 connected between the supply voltage VDD and a node 13, a resistor 16 connected between the node 13 and ground GND, a transistor 14 whose base connected to the node 13, whose emitter connected to ground GND and whose collector connected to the output 17, and a current source 18 connected between the supply voltage VDD and the output 17. When the temperature rises, the current I(T) provided by the PTAT current source 12 also increases and, as a result, the voltage on the node 13 rises. Eventually, the voltage on the node 13 will be so large to turn on the transistor 14 and thereby generating a signal on the output 17. Scheming the parameters of the circuit 10 will output the desired signal when the target temperature is reached, for example by the temperature detector circuit disclosed in U.S. Pat. No. 5,039,878 issued to Armstrong et al.

However, the parameters of IC devices are generally temperature dependent. If the parameters of elements in an IC shift from the design due to process variations, the circuit 10 will generate the trigger signal in advance or in delay, instead of at the target temperature. Unfortunately, process variation for ICs is unavoidable and the operation of the above-mentioned circuit 10 is dependent on precise process parameters. In mass production, due to the process variations, the distribution curve of the products for the actual trigger temperature becomes wider, and uniform and precise performance cannot be obtained. Moreover, since all elementary parameters of the circuit 10 are temperature dependent, once process variations presented, the actual performance at high temperature is difficult to be predicted at room temperature. In other words, it's hard to realize the circuit 10 in an IC with precise behavior at predetermined temperatures. Further, the trigger of the circuit 10 needs to overcome the turn-on voltage (Vbe) of the base-emitter of the transistor 14, which mechanism results in longer response time.

Therefore, it is desired a new temperature detector circuit and method thereof.

SUMMARY OF THE INVENTION

An object of the present invention is to provide a temperature detector circuit and method thereof for the purpose of achieving precise temperature detection, almost not affected by process variations.

Another object of the present invention is to provide a temperature detector circuit and method thereof available for calibration at any temperature.

In an embodiment of the present invention, a temperature detector circuit connected between a supply voltage and ground will generate a signal on its output when the target temperature is reached. The temperature detector circuit comprises two current sources connected in series between the supply voltage and ground, of which the first current source generates a PTAT current and the second current source is supplied with a temperature-independent reference voltage to generate a second current proportional to the reference voltage. The first and second currents are the first and second reference currents, respectively, at a reference temperature, and the first and second current sources are configured such that the ratio of the second reference current to the first reference current is proportional to the ratio of the target temperature to the reference temperature.

BRIEF DESCRIPTION OF THE DRAWINGS

These and other objects, features and advantages of the present invention will become apparent to those skilled in the art upon consideration of the following description of the preferred embodiments of the present invention taken in conjunction with the accompanying drawings, in which.

DETAILED DESCRIPTION OF THE INVENTION

Figure 1:
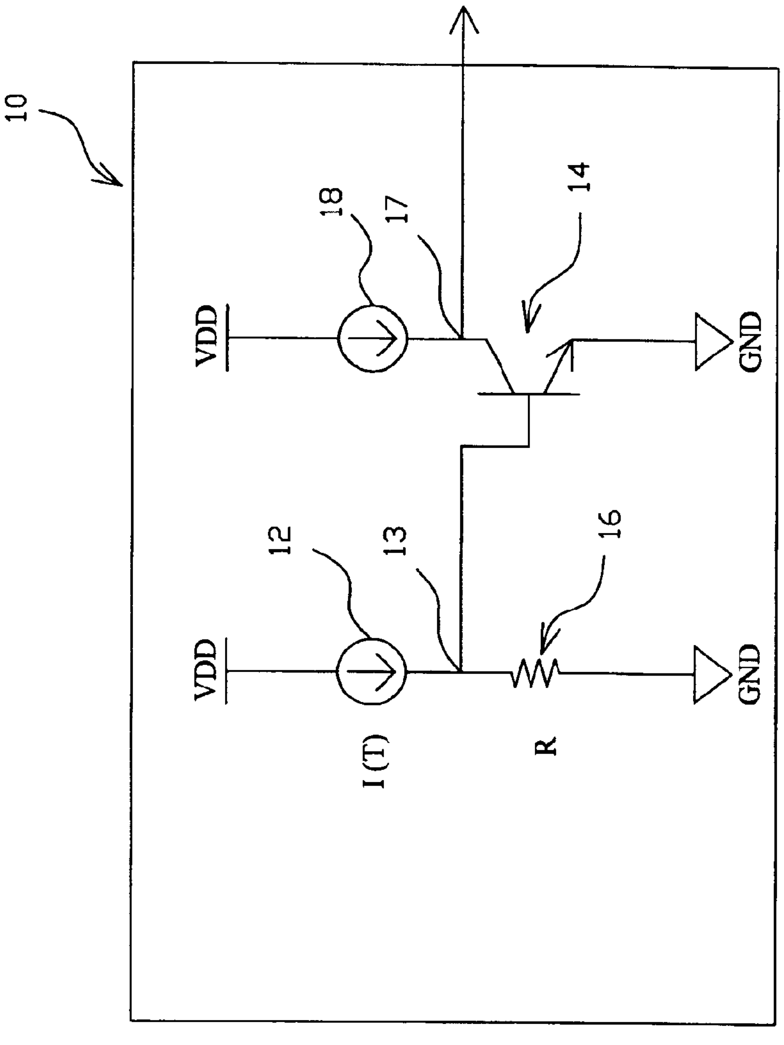
Fig. 1 (Prior Art)
FIG. 1 is a diagram of a conventional temperature detector circuit.
Figure 2:
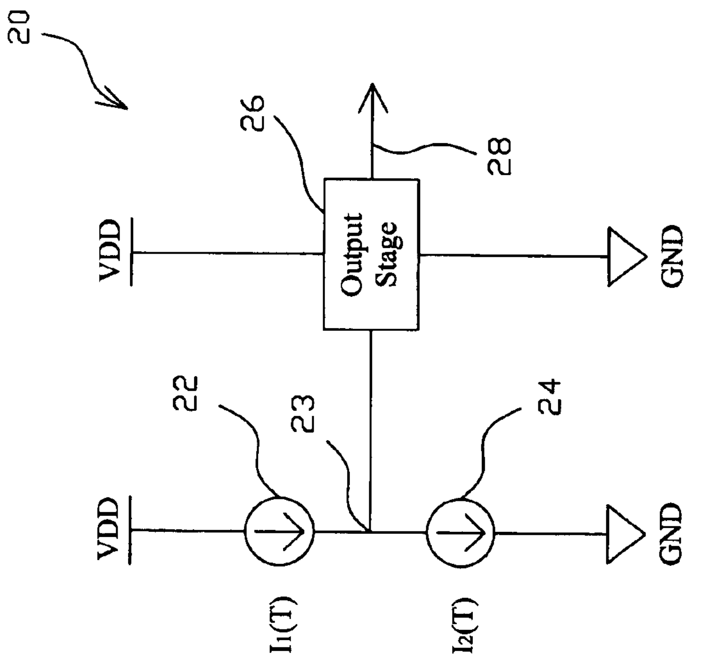
FIG. 2 is an embodiment of the temperature detector circuit of the present invention.

As shown in FIG. 2, a temperature detector circuit 20 according to the present invention comprises a current source 22 connected between a supply voltage VDD and a node 23, and a second current source 24 connected between the node 23 and ground GND. The first current source 22 generates a PTAT current $I_1(T)$, and the second current source 24 generates a current $I_2(T)$ proportional to a reference voltage that is temperature-independent and may be provided by for example conventional bandgap voltage generator. The node 23 sends signal to output 28 through an output stage 26. The first and second current sources $I_1(T)$ and $I_2(T)$ are temperature-dependent and are configured to have a predetermined ratio at a reference temperature $T_R$. In particular, at the reference temperature $T_R$, the ratio of the current $I_2(T_R)$ to the PTAT current $I_1(T_R)$ is proportional to the ratio of the target temperature $T_T$ to the reference temperature $T_R$ in absolute temperature. In this case, when the temperature reaches the target temperature $T_T$, the desired signal will be generated on the output 23. Preferably, the reference temperature is the room temperature.

Figure 3:
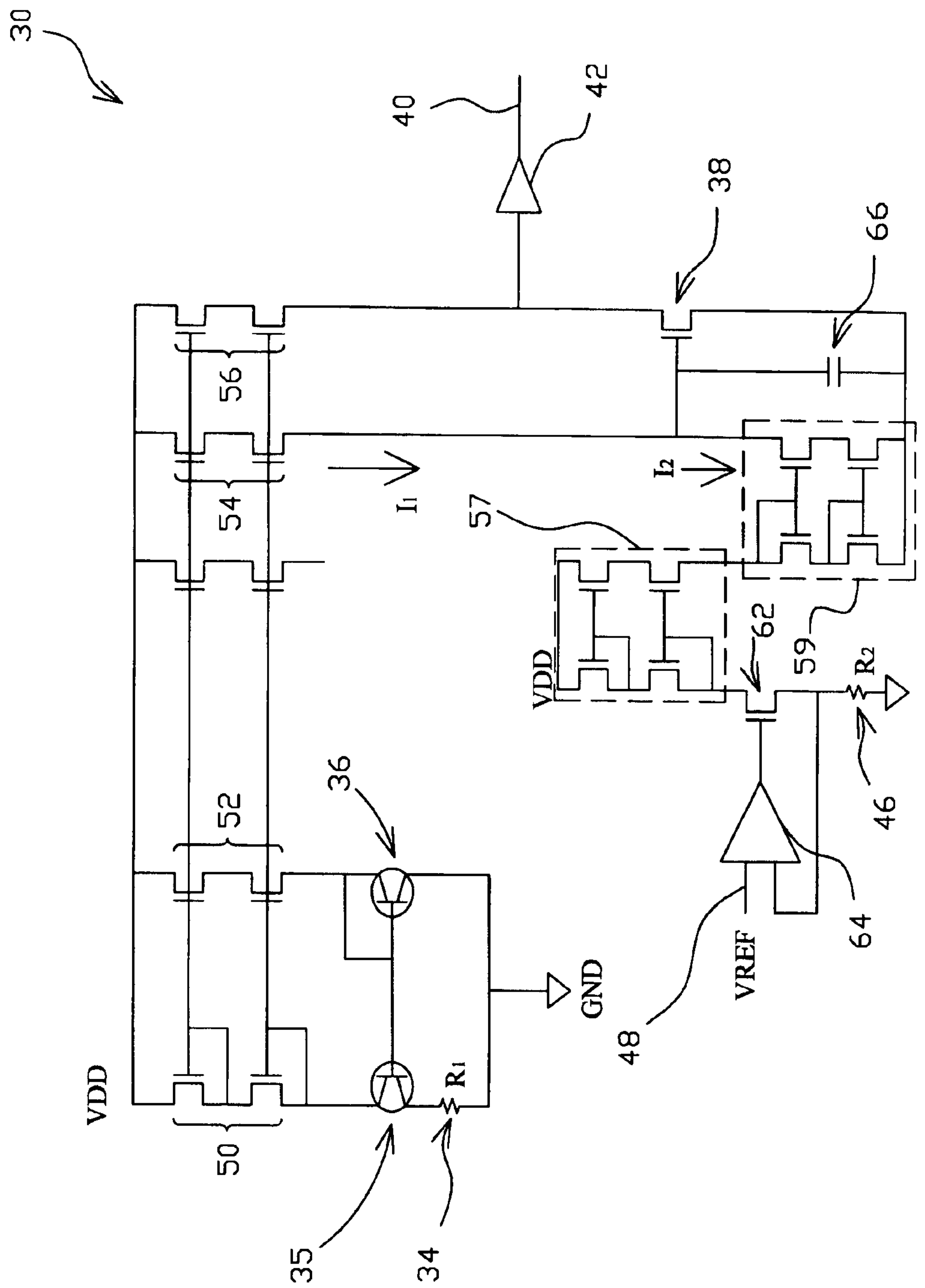
FIG. 3 is a detailed circuit of an example for the temperature detector circuit in FIG. 2.

FIG. 3 is a detailed circuit of an example for the temperature detector circuit 20 in FIG. 2. The temperature detector circuit 30 comprises a PTAT current generator having a resistor 34 connected with a pair of transistors 35 and 36. The transistor 35 is connected to the reference branch 50 of a current mirror, and the transistor 36 is connected to the mirror branch 52 of the current mirror. Another mirror branch 54 of the current mirror outputs a current $I_1$, and the mirror branch 54 is also connected to another current mirror 59, the gate of an output transistor 38 and an output capacitor 66. The drain of the NMOS transistor 38 is connected to another mirror branch 56 of the current mirror and an output buffer 42, and the latter has an output 40 to provide a signal when the target temperature $T_T$ is reached. On the other hand, a transconductive amplifier composed of an operational amplifier 64 and an NMOS transistor 62 is connected to a resistor 46. The non-inverse input 48 of the operational amplifier 64 is connected to a temperature-independent reference voltage VREF, and the inverse input is connected to the resistor 46 and the source of the NMOS transistor 62. The drain current of the NMOS transistor 62 derives an output current $I_2$ through two current mirrors 57 and 59.

The currents $I_1$ and $I_2$ in the circuit 30 represent the currents $I_1(T)$ and $I_2(T)$ in the circuit 20 of FIG. 2, which can be determined by selecting the resistances $R_1$ and $R_2$ of the resistors 34 and 36, respectively, i.e., $$I_1(T) = \frac{K_1 V_T(T)}{R_1(T)}, \quad \text{[EQ-1]}$$

and $$I_2(T) = \frac{K_2 V_{ref}(T)}{R_2(T)}, \quad \text{[EQ-2]}$$

where T is absolute temperature, $V_T$ is thermal voltage (KT/q), $K_1$ and $K_2$ are constant coefficients, and $R_1(T)$ and $R_2(T)$ are the resistances of the resistors 34 and 36 at absolute temperature T.

Derived from equation EQ-1, $$I_1(T) = \frac{K_1 V_T(T)}{R_1(T)} = \frac{K_1 V_T(T_R) \times (1 + TCI_{VT}(T - T_R))}{R_1(T_R) \times (1 + TCI_{RI}(T - T_R))}, \quad \text{[EQ-3]}$$

where $T_R$ is reference temperature in absolute temperature, and $$TCI_{VT} = \frac{\frac{dv_T(T)}{dT}}{V_T(T_R)} = \frac{1}{T_R}, \quad \text{[EQ-4]}$$

$$TCI_{RI} = \frac{\frac{dR_1(T)}{dT}}{R_1(T_R)}. \quad \text{[EQ-5]}$$

Substitutions of equation EQ-4 for EQ-5 to EQ-3 result in $$I_1(T) = I_1(T_R)\frac{\left(1 + \frac{1}{T_R}(T - T_R)\right)}{(1 + TCI_{RI}(T - T_R))}, \quad \text{[EQ-6]}$$

where $$I_1(T_R) = \frac{K_1 V_T(T_R)}{R_1(T_R)} \quad \text{[EQ-7]}$$

is the first current $I_1(T)$ at the reference temperature $T_R$, called first reference current.

Derived from equation EQ-2, $$I_2(T) = \frac{K_2 V_{ref}}{R_2(T)} = \frac{K_2 V_{ref}}{R_2(T_R) \times (1 + TCI_{R2}(T - T_R))}, \quad \text{[EQ-8]}$$

where

-continued $$TCI_{R2} = \frac{\frac{dR_2(T)}{dT}}{R_2(T_R)}. \quad \text{[EQ-9]}$$

Substitution of equation EQ-9 to equation EQ-8 results in $$I_2(T) = I_2(T_R)\frac{1}{(1 + TCI_{R2}(T - T_R))}, \quad \text{[EQ-10]}$$

where $$I_2(T_R) = \frac{K_2 V_{ref}}{R_2(T_R)} \quad \text{[EQ-11]}$$

is the second current $I_2(T)$ at the reference temperature $T_R$, called second reference current.

When temperature T equals to the target temperature $T_T$, let $$I_1(T_T) = KI_2(T_T), \quad \text{[EQ-12]}$$

where K is constant coefficient, and according to equations EQ-6 and EQ-10 it is obtained $$I_1(T_R)\frac{\left(1 + \frac{1}{T_R}(T - T_R)\right)}{(1 + TCI_{RI}(T - T_R))} = KI_2(T_R)\frac{1}{(1 + TCI_{R2}(T - T_R))}. \quad \text{[EQ-13]}$$

Assuming that the resistors 34 ($R_1$) and 46 ($R_2$) are made of same material or have same thermal coefficient, i.e., $$TC1_{R1} = TC1_{R2}, \quad \text{[EQ-14]}$$

with substitution of this to equation EQ-13, it is obtained $$I_1(T_R)\left(1 + \frac{(T_T)}{(T_R)} - 1\right) = KI_2(T_R). \quad \text{[EQ-15]}$$

After rearranged, equation EQ-15 becomes $$\frac{T_T}{T_R} = K\frac{I_2(T_R)}{I_1(T_R)} = K\frac{K_2 R_1(T_R) V_{ref}}{K_1 R_2(T_R) V_T(T_R)}, \quad \text{[EQ-16]}$$

which is a constant. In other words, the ratio of the target temperature $T_T$ for the temperature detector circuit 20 or 30 to behave to the reference temperature $T_R$ is proportional to the ratio of the currents (i.e., $I_2(T_R)$ and $I_1(T_R)$) of the two current sources 24 and 22 at the reference temperature $T_R$. As a result, the target temperature $T_T$ is proportional to the product of the current ratio of $I_2(T)$ and $I_1(T)$ at the reference temperature $T_R$ and the reference temperature $T_R$, and the temperature detector circuit 20 or 30 is almost independent on process parameters. From equation EQ-16, the ratio of the target temperature $T_T$ to the reference temperature $T_R$ is proportional to the product of the ratio of the resistances (i.e., $R_1(T_R)$ and $R_2(T_R)$) of the resistors 34 and 46 at room temperature $T_R$ and the reference voltage $V_{ref}$. In other words, the target temperature $T_T$ for the temperature detector circuit 20 or 30 to behave will be precisely controlled, only that the ratio of $R_1(T_R)$ and $R_2(T_R)$ of the resistors 34 and 46 at the reference temperature $T_R$ and the reference voltage $V_{ref}$ are determined.

In general, the ratio of resistors can be precisely controlled in IC process. From the above description, in the inventive temperature detector circuit and method thereof, the resistance variations and thermal effect to temperature detection are removed, and hence, the inventive temperature detector circuit and method thereof is almost independent on process variations. As a result, the trigger temperature of the circuit can be predicted, and the circuit is easy to implement, without precise simulation model. Moreover, the products will have uniform performance in mass production, and can be calibrated at any desired temperature.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. A temperature detector circuit for generating an output when a target temperature is reached, the temperature detector circuit comprising:

a first current source for generating a first PTAT current which is a first reference current at a reference temperature;

a second current source connected in series to the first current source through a node and supplied with a temperature-independent reference voltage for generating a second current proportional to the reference voltage, which is a second reference current at the reference temperature;

wherein the first and second current sources are configured such that a ratio of the second reference current to the first reference current is proportional to a ratio of the target temperature to the reference temperature; and, an output stage connected to the node for producing the output, wherein the output stage includes:

a MOS transistor having a gate connected to the node, a drain connected to a current path, and a source connected to a low voltage;

a capacitor connected between the node and source; and a buffer connected to the drain for providing the output.

2. The temperature detector circuit of claim 1, wherein the first current source includes a current generator for generating a second PTAT current to derive the first PTAT current.

3. The temperature detector circuit of claim 2, wherein the first current source further includes a current mirror for mirroring the second PTAT current to produce the first PTAT current.

4. The temperature detector circuit of claim 1, wherein the second current source includes a transconductive amplifier for transforming the reference voltage to a third current to derive the second current.

5. The temperature detector circuit of claim 4, wherein the second current source further includes a current mirror for mirroring the third current to produce the second current.

6. The temperature detector circuit of claim 1, wherein the first current source includes a first resistor for determining the first PTAT current, the second current source includes a second resistor for determining the second current, and the first and second resistors have a ratio at the reference temperature proportional to the ratio of the target temperature to the reference temperature.

7. The temperature detector circuit of claim 6, wherein the first and second resistors have a substantially same thermal coefficient.

8. The temperature detector circuit of claim 6, wherein the first and second resistors are made of a substantially same material.

9. The temperature detector circuit of claim 1, wherein the reference temperature is room temperature.

10. A method for generating an output when a target temperature is reached, the method comprising the steps of:

connecting a first and second current sources in series through a node;

connecting a gate of a MOS transistor to the node, a drain to a current path, and a source to a low voltage;

connecting a capacitor between the node and source;

connecting a buffer to the drain for providing the output;

generating a first PTAT current by the first current source;

supplying a temperature-independent reference voltage to the second current source for generating a second current proportional to the reference voltage;

selecting a reference temperature for the first and second current to be a first and second reference currents, respectively, at the reference temperature and with a ratio of the second reference current to the first reference current proportional to a ratio of the target temperature to the reference temperature; and generating the output when the target temperature is reached.

11. The method of claim 10, further comprising the steps of:

generating a second PTAT current by a current generator; and deriving the first PTAT current from the second PTAT current.

12. The method of claim 11, further comprising mirroring the second PTAT current for generating the first PTAT current.

13. The method of claim 10, further comprising the steps of:

transforming the reference voltage to a third current by a transconductive amplifier; and deriving the second current from the third current.

14. The method of claim 13, further comprising mirroring the third current for generating the second current.

15. The method of claim 10, further comprising the steps of:

selecting a first resistor for determining the first PTAT current; and selecting a second resistor for determining the second current;

wherein the first and second resistors have a ratio at the reference temperature proportional to the ratio of the target temperature to the reference temperature.

16. The method of claim 15, wherein the first and second resistors are selected to have a substantially same thermal coefficient.

17. The method of claim 15, wherein the first and second resistors are selected to be made of a substantially same material.

18. The method of claim 10, further comprising selecting the reference temperature to be room temperature.

19. The method of claim 10, further comprising connecting an output stage to the node for producing the output.

* * * * *